(12) United States Patent
Kikuchi

(10) Patent No.: US 8,836,135 B2
(45) Date of Patent: Sep. 16, 2014

(54) SEMICONDUCTOR DEVICE WITH INTERCONNECTION CONNECTING TO A VIA

(75) Inventor: Hirokazu Kikuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/370,723

(22) Filed: Feb. 10, 2012

(65) Prior Publication Data

US 2012/0223438 A1    Sep. 6, 2012

(30) Foreign Application Priority Data

Mar. 1, 2011    (JP) .................................. 2011-044247

(51) Int. Cl.
| | | |
|---|---|---|
| H01L 23/538 | (2006.01) | |
| H01L 21/768 | (2006.01) | |
| H01L 23/528 | (2006.01) | |
| H01L 23/522 | (2006.01) | |

(52) U.S. Cl.
CPC ...... H01L 21/76816 (2013.01); H01L 23/5226 (2013.01); H01L 21/76805 (2013.01)
USPC ............ 257/774; 257/E23.151; 257/E21.577; 257/E23.143; 257/E23.152; 257/E23.174; 257/E21.585; 257/315; 257/309; 257/700; 257/701; 257/758; 257/773; 257/775; 257/778

(58) Field of Classification Search
USPC .......... 257/774, E23.174, E21.585, 324, 315, 257/E29.309, 700, 701, 758, 773, 775, 778, 257/E23.143, E23.151, E23.152, E21.577
See application file for complete search history.

(56) References Cited

U.S. PATENT DOCUMENTS

| | | | | |
|---|---|---|---|---|
| 4,840,923 | A | * | 6/1989 | Flagello et al. .................. 216/18 |
| 4,958,222 | A | * | 9/1990 | Takakura et al. ............. 257/659 |
| 5,227,013 | A | * | 7/1993 | Kumar ............................ 216/18 |
| 5,905,307 | A | * | 5/1999 | Onoda .......................... 257/775 |
| 6,034,436 | A | * | 3/2000 | Iwasaki ......................... 257/774 |
| 6,645,842 | B2 | * | 11/2003 | Igarashi et al. ............... 438/598 |
| 7,879,670 | B2 | * | 2/2011 | Nansei et al. .................. 438/237 |
| 8,044,456 | B2 | * | 10/2011 | Nagashima et al. .......... 257/326 |
| 8,194,453 | B2 | * | 6/2012 | Maejima .................. 365/185.11 |

(Continued)

FOREIGN PATENT DOCUMENTS

| | | |
|---|---|---|
| JP | 2-189953 | 7/1990 |
| JP | 3-88334 | 4/1991 |

(Continued)

OTHER PUBLICATIONS

Office Action issued May 14, 2013, in Japanese Patent Application No. 2011-044247 with English translation.

*Primary Examiner* — Alexander Oscar Williams
(74) *Attorney, Agent, or Firm* — Oblon, Spivak, McClelland, Maier & Neustadt, L.L.P.

(57) ABSTRACT

A semiconductor device including: a semiconductor substrate; a plurality of interconnect layers disposed at different heights from the semiconductor substrate, each interconnect layer including an interconnection formed therein; and a via formed in a columnar shape extending in the stack direction of the interconnect layers, the via electrically connecting the interconnections of the different interconnect layers, the interconnections including an intermediate interconnection in contact with the via in the intermediate portion thereof, and the intermediate interconnection including a first type intermediate interconnection passing through the via in a direction perpendicular to the stack direction and in contact with the via on the top surface, bottom surface, and both side surfaces thereof.

15 Claims, 11 Drawing Sheets

(56) References Cited

U.S. PATENT DOCUMENTS

| | | | |
|---|---|---|---|
| 8,198,667 B2* | 6/2012 | Kuniya et al. | 257/315 |
| 2005/0023589 A1* | 2/2005 | Yamada et al. | 257/310 |
| 2009/0283819 A1* | 11/2009 | Ishikawa et al. | 257/324 |
| 2010/0187698 A1* | 7/2010 | Uchiyama | 257/774 |
| 2011/0215394 A1* | 9/2011 | Komori et al. | 257/324 |
| 2011/0215473 A1* | 9/2011 | Noda et al. | 257/750 |
| 2012/0018796 A1* | 1/2012 | Yahashi et al. | 257/324 |
| 2012/0146127 A1* | 6/2012 | Lee et al. | 257/324 |
| 2012/0199982 A1* | 8/2012 | Kikuchi | 257/774 |
| 2012/0322252 A1* | 12/2012 | Son et al. | 438/591 |
| 2013/0032930 A1* | 2/2013 | Kawano | 257/621 |
| 2013/0057738 A1* | 3/2013 | Konno et al. | 348/294 |
| 2013/0130468 A1* | 5/2013 | Higashitani et al. | 438/382 |

FOREIGN PATENT DOCUMENTS

| | | |
|---|---|---|
| JP | 8-306774 A | 11/1996 |
| JP | 11-145281 | 5/1999 |
| JP | 2004-63855 A | 2/2004 |
| JP | 2007-88439 A | 4/2007 |
| JP | 2010-177276 | 8/2010 |

* cited by examiner

SEMICONDUCTOR DEVICE WITH INTERCONNECTION CONNECTING TO A VIA

CROSS-REFERENCE TO RELATED APPLICATIONS

This application is based upon and claims the benefit of priority from the prior Japanese Patent Application No. 2011-044247, filed on Mar. 1, 2011, the entire contents of which are incorporated herein by reference.

FIELD

The embodiments herein relate to a semiconductor device and a method of manufacturing the same.

BACKGROUND

Many of semiconductor devices having a stacked structure with a plurality of stacked interconnect layers include vias for connecting an interconnection in a certain interconnect layer to an interconnection in a different interconnect layer. Some vias simply connect an upper-layer interconnection and a lower-layer interconnection. Others connect an upper-layer interconnection or a lower-layer interconnection to an intermediate interconnection formed on an intermediate portion of a via. The intermediate portion of the via is a portion between a top surface and a bottom surface thereof.

The via connected to the intermediate interconnection is formed as follows. Before forming the via, a via connection portion is formed at the end portion of the intermediate interconnection to overlap a region where the via is formed. The via connection portion is a portion of the intermediate interconnection for connecting the via. Then, before forming the upper-layer interconnection, a through-hole for embedding the via is formed until the lower-layer interconnection is reached. The through-hole is formed by etching an insulating film using a resist mask having a pattern for the via formed therein until the via connection portion is exposed, and after the via connection portion is exposed, further etching using the via connection portion as a mask. In so doing, the through-hole is formed using a process by which it is easy to etch the insulating film and it is hard to etch an interconnection material. Then, a via material such as tungsten (W) is embedded into the formed through-hole. Finally, the upper-layer interconnection is formed in connection with the top surface of the via, thereby connecting the upper-layer interconnection, the intermediate interconnection, and the lower-layer interconnection via the via.

In this method, however, steps are formed in the via at a connection location with the via connection portion. The via thus thins toward the lower layers. This facilitates misalignment between the via and the lower intermediate interconnection and lower-layer interconnection. As a result, it is hard to ensure sufficient contact area between the via and the lower intermediate interconnection and lower-layer interconnection. When using this method, therefore, a misalignment margin needs to be added to the via and the interconnection to reduce the misalignment between the via and the interconnection. Note that, in this case, a new problem of increased chip area will arise.

As a method for solving the problem of the misalignment between the via and the interconnection, a method is proposed to remove, in the through-hole forming process, the intermediate interconnection at the same time and expose the end portion of the intermediate interconnection on the side surface of the through-hole. In this case, the formed through-hole can be embedded with an interconnection material to connect the via side surface and the intermediate interconnection end portion. This method can contact the via and the intermediate interconnection in self-alignment, thereby facilitating the alignment between the via and the interconnection.

When using this method, however, if it is hard to have a large cross section of the intermediate interconnection, it is also hard to ensure the sufficient contact area between the via and the intermediate interconnection, thereby increasing contact resistance.

DETAILED DESCRIPTION

A semiconductor device according to an embodiment includes: a semiconductor substrate; a plurality of interconnect layers disposed at different heights from the semiconductor substrate, each interconnect layer including an interconnection formed therein; and a via formed in a columnar shape extending in a stack direction of the interconnect layers, the via electrically connecting the interconnections of the different interconnect layers, the interconnections including an intermediate interconnection in contact with the via in the intermediate portion thereof, and the intermediate interconnection including a first type intermediate interconnection passing through the via in a direction perpendicular to the stack direction and in contact with the via on the top surface, bottom surface, and both side surfaces thereof.

A semiconductor device and a method of manufacturing the same according to the embodiments will be described below, referring to the attached drawings.

First Embodiment

First, the structure of a semiconductor device according to a first embodiment will be described.

Figure 1:
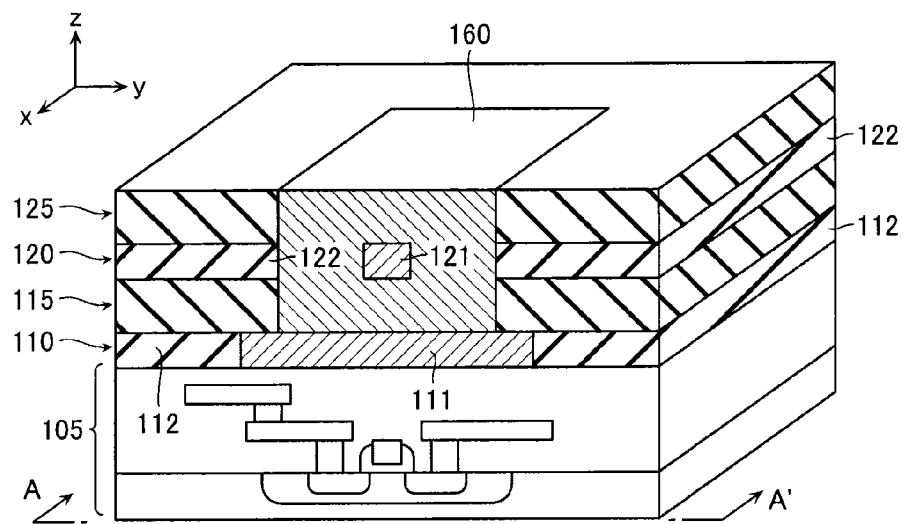
FIG. 1 is a perspective view of a peripheral portion of a via of a semiconductor device according to a first embodiment.
Figure 2:
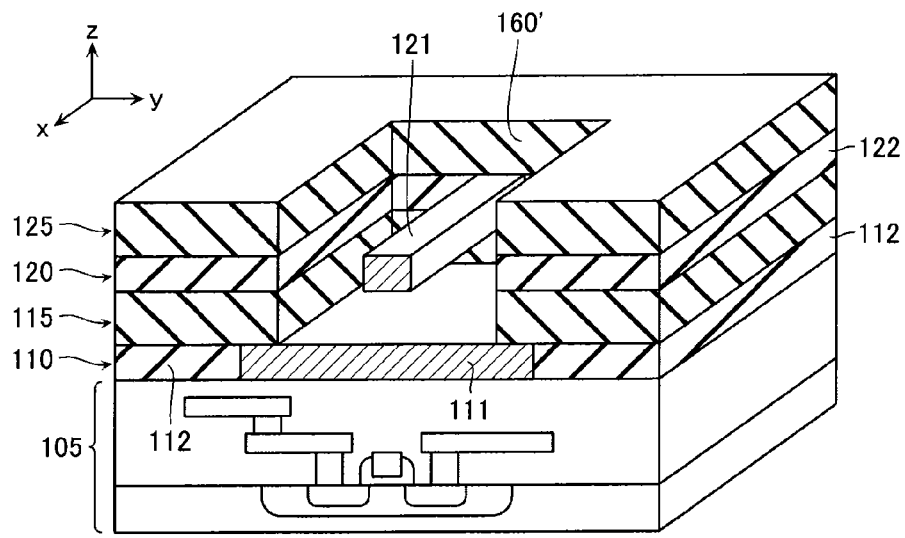
FIG. 2 is a perspective view of the peripheral portion of the via of the semiconductor device according to the embodiment.

FIG. 1 is a perspective view of the semiconductor device according to this embodiment. FIG. 2 shows the internal structure of the semiconductor device according to this embodiment with a portion of the semiconductor device shown in FIG. 1 being removed for simplicity.

The semiconductor device according to this embodiment includes a silicon (Si) substrate 105 having a transistor and an interconnection formed therein, and a plurality of layers stacked on the silicon substrate 105 in the z-direction. The stacked layers include a lower-layer interconnect layer 110, an insulating layer 115, a first interconnect layer 120, and an insulating layer 125. The semiconductor device also includes a via 160 formed in a columnar shape in the z-direction. The via 160 has a lower end at the top surface of the lower-layer interconnect layer 110 and an upper end at the top surface of the insulating layer 125.

The lower-layer interconnect layer 110 includes a lower-layer interconnection 111 and an insulating film 112 formed around the lower-layer interconnection 111. The lower-layer interconnection 111 includes an electrically conductive film such as tungsten (W), aluminum (Al), or copper (Cu). The lower-layer interconnection 111 is connected to the bottom surface of the via 160.

The first interconnect layer 120 includes a first interconnection 121 and insulating films 122 formed around the first interconnection 121. The first interconnection 121 includes an electrically conductive film such as tungsten, aluminum, or copper. The first interconnection 121 is formed passing through the via 160 in the x-direction as shown in FIG. 2.

Note that an interconnection such as the first interconnection 121 disposed between the top surface and the bottom surface of the via 160 may be hereinafter referred to an "intermediate interconnection."

The via 160 is formed by embedding electrically conductive films such as tungsten, aluminum, and copper in the through-hole 160' formed passing through the layers 125, 120 and 115. The via 160 is formed in contact with the first interconnection 121 (a first type intermediate interconnection) on the top surface, bottom surface and both side surfaces thereof, the first interconnection 121 being unetched and left in forming the through-hole 160'. The lower-layer interconnection 111 and the second interconnection 121 are thus electrically connected by the via 160.

Figure 3:
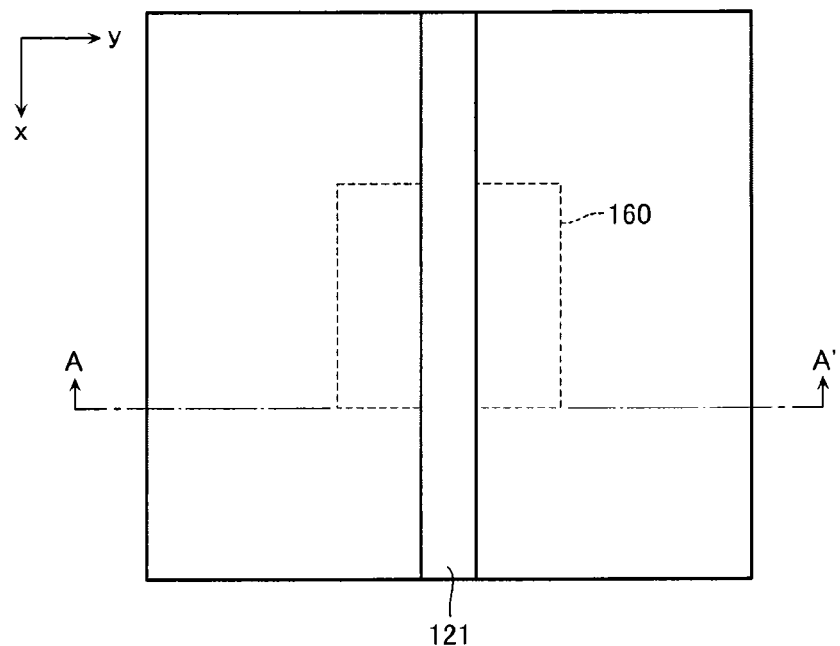
FIG. 3 shows an example arrangement of interconnections in the via of the semiconductor device according to the embodiment.

FIG. 3 shows the positional relationship between the first interconnection 121 and the via 160 seen in the z-direction. In the figure, the dotted-line-enclosed region shows the region where the via 160 is formed. Also in the figure, the long and short dashed line shows the A-A' cross-section in FIG. 1. With reference to FIG. 3, it can be seen that the first interconnection 121 is formed passing through the via 160 in the x-direction.

Now, a method of manufacturing the semiconductor device according to this embodiment will be described, referring to FIG. 4-FIG. 10.

Figure 4:
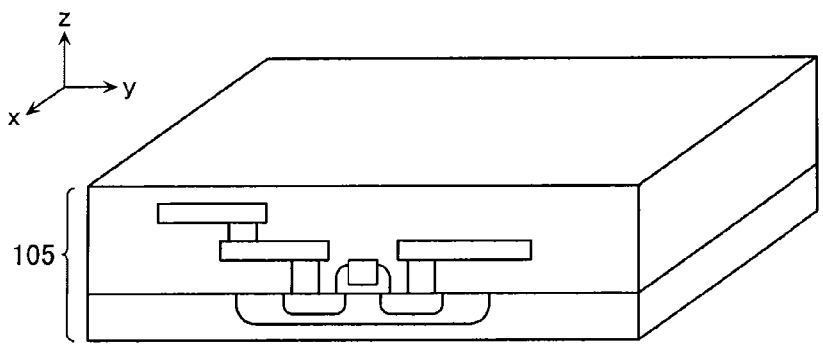
FIG. 4 illustrates a manufacturing process of the semiconductor device according to the embodiment.

First, as shown in FIG. 4, a silicon substrate 105 including a transistor and an interconnection formed therein is formed by a well-known method.

Figure 5:
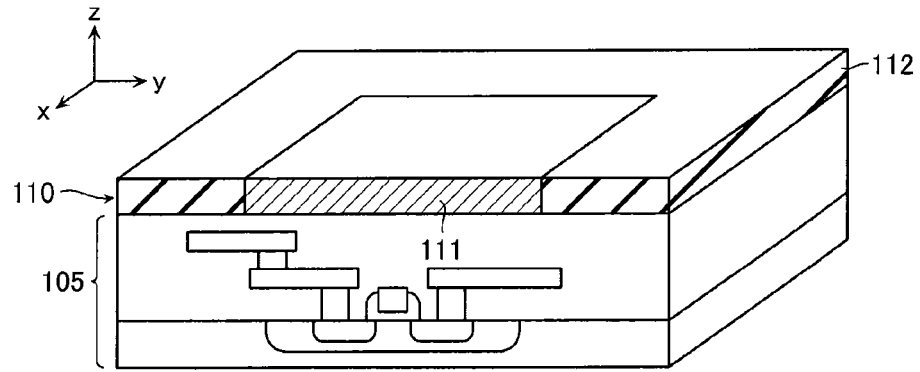
FIG. 5 illustrates a manufacturing process of the semiconductor device according to the embodiment.

Then, as shown in FIG. 5, the lower-layer interconnect layer 110 is formed on the silicon substrate 105. In so doing, first, an insulating material that will serve as the insulating film 112 in the lower-layer interconnect layer 110 is stacked. Then, an insulating material where the lower-layer interconnection 111 is to be formed is removed using a lithography method. Finally, the portion from which the insulating material is removed is embedded with an interconnection material using a damascene method to form the lower-layer interconnection 111 therein. The lower-layer interconnection 111 may be formed to include the region where the via 160 is formed, thereby contacting the entire bottom face of the via 160 with the lower-layer interconnection 111. The contact resistance between the via 160 and the lower-layer interconnection 111 may thus be reduced.

Note that instead of the above process, the lower-layer interconnect layer 110 may be formed using a process in which the lower-layer interconnection 111 is first formed. Specifically, the interconnection material of the lower-layer interconnection 111 is first stacked. Then, the stacked interconnection material is processed by the lithography method to form the lower-layer interconnection 111. Finally, an insulating material that will serve as the insulating film 112 is embedded over and around the lower-layer interconnection 111. The top surface of the insulating material 111 is then planarized by a process such as CMP until the top surface of the lower-layer interconnection 111 is exposed.

The above is the forming process of the lower-layer interconnect layer 110.

Figure 6:
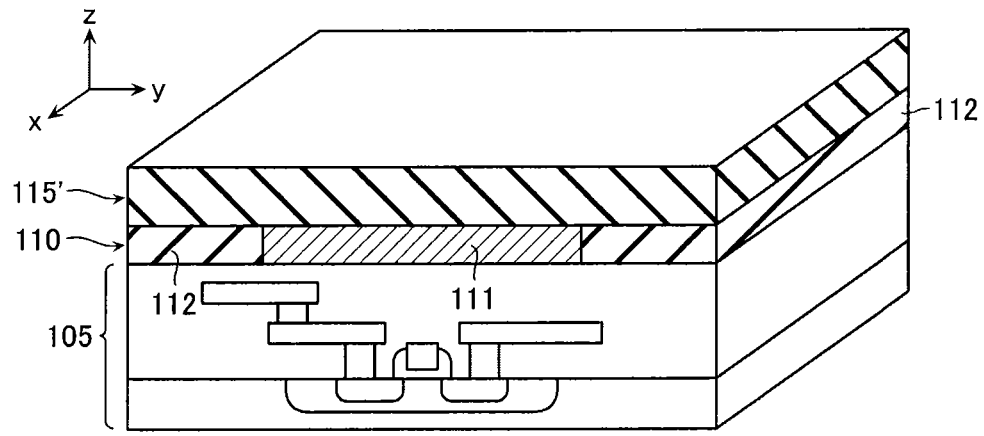
FIG. 6 illustrates a manufacturing process of the semiconductor device according to the embodiment.

Then, as shown in FIG. 6, a layer 115' that will serve as the insulating layer 115 is deposited on the lower-layer interconnect layer 110. The layer 115' may avoid short-circuit between the lower-layer interconnection 111 and the first interconnection 121 formed later.

Figure 7:
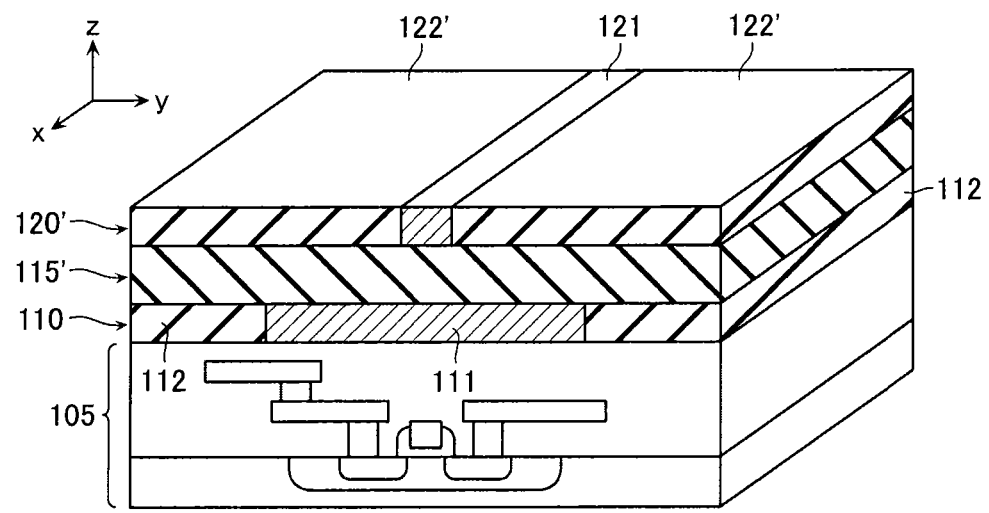
FIG. 7 illustrates a manufacturing process of the semiconductor device according to the embodiment.

Then, as shown in FIG. 7, a layer 120' that will serve as the first interconnect layer 120 is formed on the layer 115' that will serve as the insulating layer 115. The layer 120' is formed in a process similar to that of the lower-layer interconnect layer 110. The first interconnection 121 extending in the x-direction is thus formed. Films 122' that will serve as the insulating films 122 are also formed around the first interconnection 121.

Figure 8:
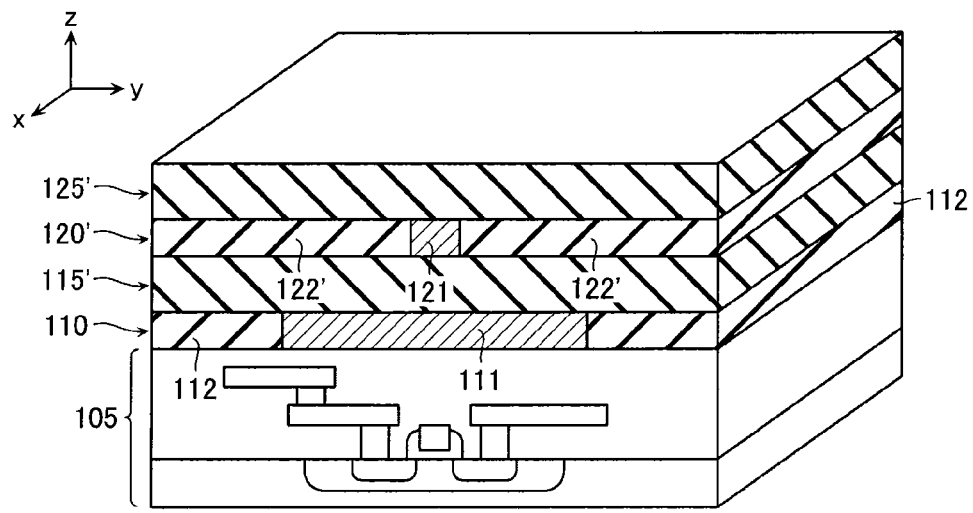
FIG. 8 illustrates a manufacturing process of the semiconductor device according to the embodiment.

Then, as shown in FIG. 8, a layer 125' that will serve as the insulating layer 125 is formed on the layer 120' that will serve as the first interconnect layer. This layer 125' may prevent, when an interconnection is provided in a further upper layer on the first interconnection 121, short-circuit between the first interconnection 121 and the upper-layer interconnection.

Here, the first interconnection 121 in contact with the via 160 in the intermediate portion thereof is disposed passing through the via 160 as shown in FIG. 3.

Figure 9:
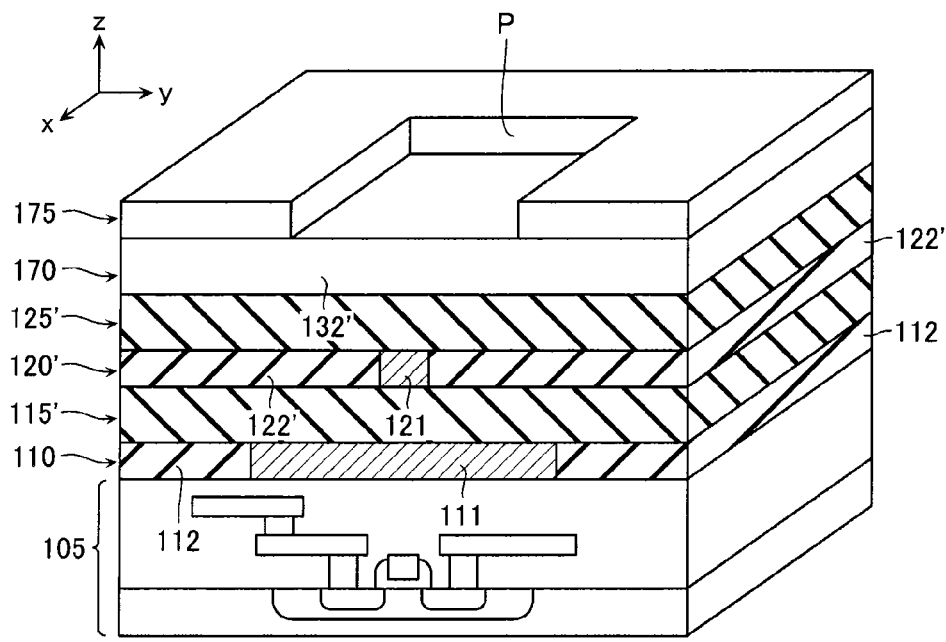
FIG. 9 illustrates a manufacturing process of the semiconductor device according to the embodiment.

Then, as shown in FIG. 9, a sacrificial film 170 is formed on the layer 125' that will serve as the insulating layer 125. Then, a resist 175 having a pattern P for the via 160 formed therein is formed on the sacrificial film 170 by a lithography method.

Figure 10:
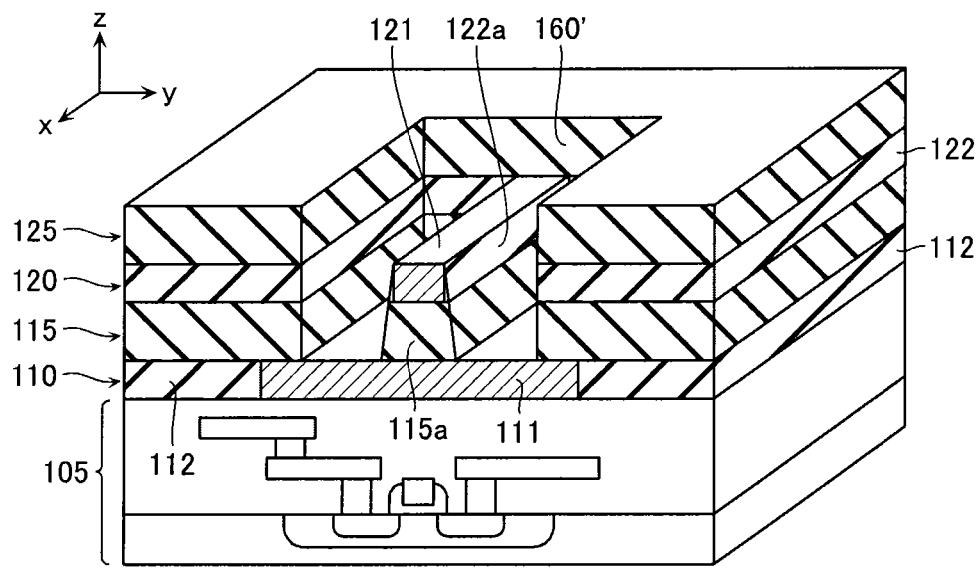
FIG. 10 illustrates a manufacturing process of the semiconductor device according to the embodiment.

Then, as shown in FIG. 10, a through-hole 160' is formed by anisotropic etching such as Reactive Ion Etching (RIE) until the top surface of the lower layer interconnect layer 110 is reached. In so doing, the pattern P for the via 160 is transferred to the sacrificial film 170 using the resist 175 as a mask, thereby processing the layers 125' to 115'. The layers 125' to 115' are processed into a vertical or forward tapered shape to provide good embedding characteristics of the materials of the via 160. Note that the first interconnection 121 is exposed in the middle of forming the through-hole 160'. In order to allow the first interconnection 121 to remain, anisotropic etching is performed with the etching conditions appropriately set, including the etching selectivity of the interconnection materials and insulating materials and the like. The layers 125' to 115' are thus removed in the pattern P of the via 160, except portions 115a and 122a located under the first interconnection 121 and in the vicinity of the both side surfaces thereof. Hereinafter, the portions 115a and 122a are referred to as "remaining insulating films". At this point, the first interconnection 121 has its top surface exposed in the through-hole 160'.

Then, as shown in FIG. 2, the remaining insulating films 115a and 122a left under the first interconnection 121 and at the both sides of the first interconnection 121 are removed by isotropic etching. As a result, the first interconnection 121 becomes so-called an air-gap interconnection that crosses over the through-hole 160' in the x-direction and whose top surface, bottom surface, and both side surfaces are exposed in the through-hole 160'.

Note that isotropic etching may be wet etching using chemical solution that dissolves the materials of the remaining insulating films 115a and 122a. Because, in this case, the chemical solution enters under the first interconnection 121, the remaining insulating films 115a and 122a may be removed even for a large aspect ratio of the through-hole 160'.

Instead of the above-described wet etching, isotropic etching may be dry etching that directs plasma from the opening of the through-hole 160' to the remaining insulating films 115a and 122a. Dry etching is better than wet etching in controllability, thereby allowing precise removal of the insulating film.

Finally, a barrier metal and an interconnection material such as tungsten, aluminum, or copper are embedded into the through-hole 160'. The via 160 is thus formed which is connected to the first interconnection 121 on the top surface, bottom surface, and both side surfaces thereof. The via 160 and the two interconnections 111 and 121 may thus be electrically connected. Then, unnecessary interconnection materials are removed by CMP.

Using the above manufacturing process, the semiconductor device shown in FIG. 1 may be manufactured.

Thus, this embodiment may ensure more reliably the contact between the via and the intermediate interconnection in self-alignment, compared to the hook structure used to make contact between the via and the intermediate interconnection. In addition, unlike when the hook structure is used, the via diameter does not decrease in the middle of the via in this embodiment. Accordingly, the contact area between the via and the intermediate interconnection may be ensured more easily, thereby facilitating the via size reduction. Further, compared to when the via and the intermediate interconnection make contact on the side surfaces of the via, a larger contact area may be ensured between the via and the intermediate interconnection in this embodiment, thereby drastically reducing the contact resistance.

Figure 11:
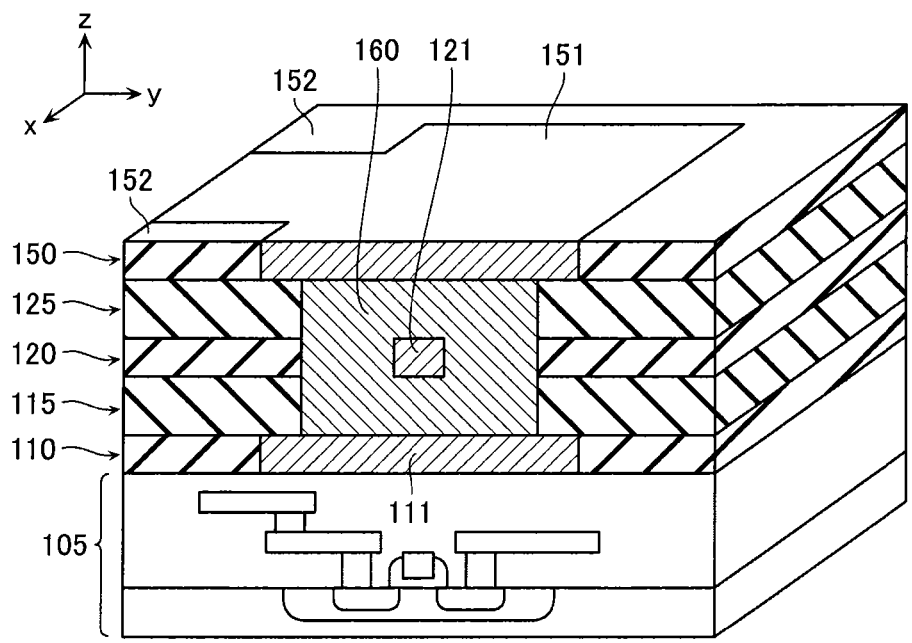
FIG. 11 is a perspective view of the peripheral portion of the via of the semiconductor device according to the embodiment.

Note that, after completing a structure of FIG. 1, an upper-layer interconnect layer 150 may further be formed on the via 160 and the insulating layer 125. The upper-layer interconnect layer 150 includes, as shown in FIG. 11, an upper-layer interconnection 151 in contact with the top surface of the via 160 and the insulating film 152 formed around the upper-layer interconnection 151. The upper-layer interconnection 151 may be formed to cover the region where the via 160 is formed, thereby bringing the entire top surface of the via 160 into contact with the upper-layer interconnection 151. This may reduce the contact resistance between the via 160 and the upper-layer interconnection 151. With the manufacturing process as shown in FIG. 11, the via 160 and the three interconnections 111, 121, and 151 may be electrically connected.

Now, some other examples of the semiconductor device according to this embodiment will be described.

Figure 12:
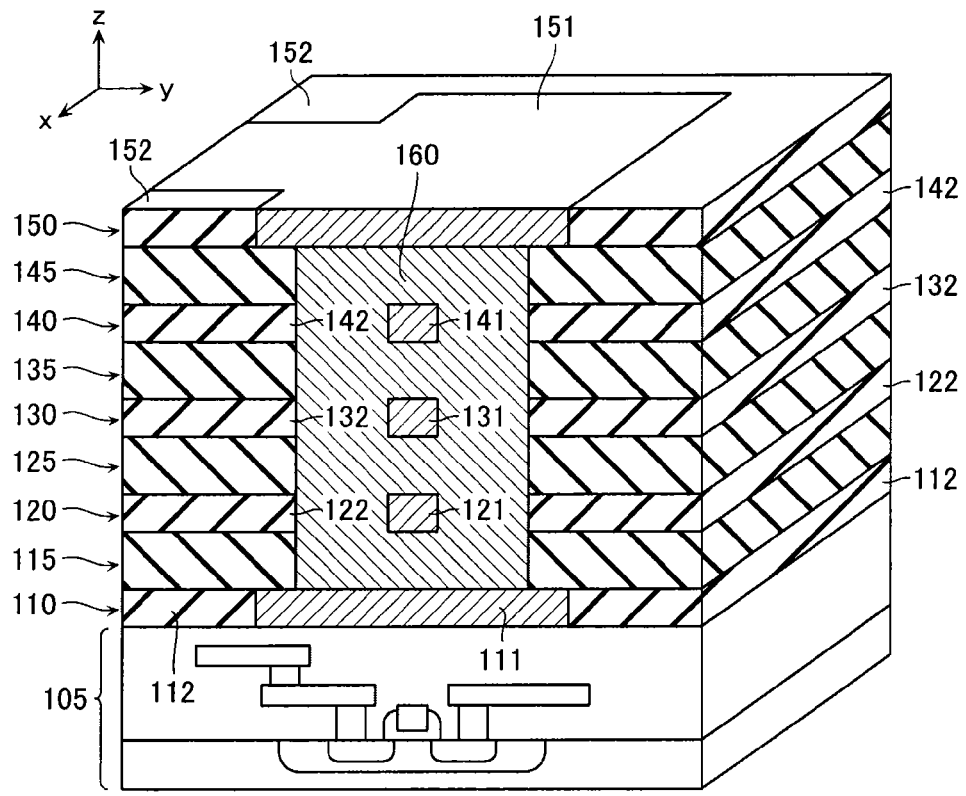
FIG. 12 is a perspective view of the peripheral portion of the via of the semiconductor device according to the embodiment.

FIG. 12 is an example where the semiconductor device shown in FIG. 1 includes a plurality of intermediate interconnections. FIG. 12 shows three intermediate interconnections, including the first interconnection 121 and two more interconnections thereabove, including a second interconnection 131 (the first type intermediate interconnection) and a third interconnection 141 (the first type intermediate interconnection).

The semiconductor device shown in FIG. 12 may be manufactured by repeating, after the above manufacturing process shown in FIG. 6, the manufacturing processes shown in FIG. 7 and FIG. 8 by the number of desired intermediate interconnections (three times). In other words, the following layers may be sequentially stacked on the layer 115' that will serve as the insulating layer 115: the layer 120' that will serve as the interconnect layer 120; the layer 125' that will serve as the insulating layer 125; a layer 130' that will serve as the interconnect layer 130; a layer 135' that will serve as the insulating layer 135; a layer 140' that will serve as the interconnect layer 140; and a layer 145' that will serve as the insulating layer 145. Note that like the layer 120' that will serve as the interconnect layer 120, the layer 130' that will serve as the interconnect layer 130 includes the second interconnection 131 extending in the x-direction and insulating films 132 disposed on both sides of the interconnection 131. The layer 140' that will serve as the interconnect layer 140 includes the third interconnection 141 extending in the x-direction and insulating films 142 disposed on both sides of the interconnection 141.

In this way, in this embodiment, the manufacturing processes shown in FIG. 7 and FIG. 8 may only be repeated to facilitate manufacturing a semiconductor device including a multilayered interconnection structure.

Figure 13:
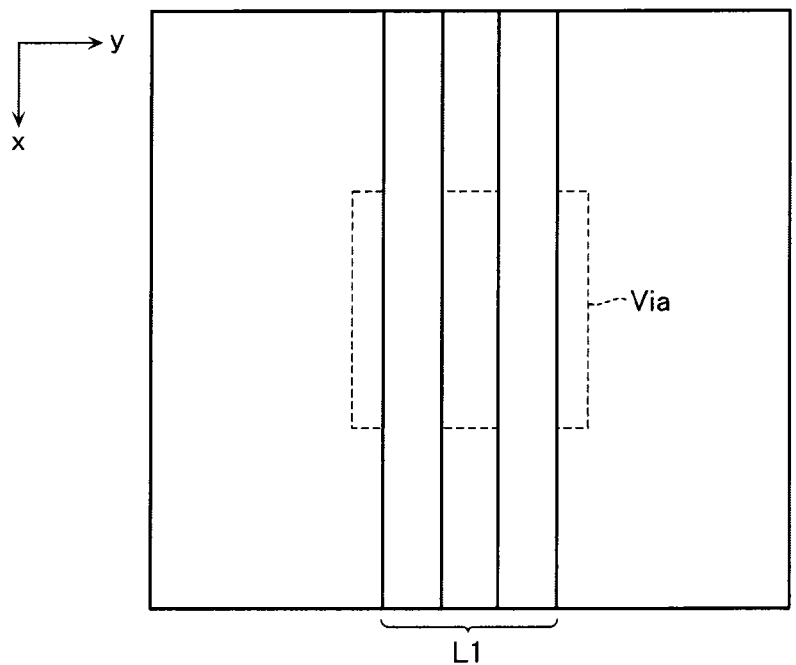
FIG. 13 shows an example arrangement of interconnections in the via of the semiconductor device according to the embodiment.

FIG. 13 shows an example where two intermediate interconnections L1 (the first type intermediate interconnection) passing through the via are disposed. This example is effective when it is hard to widen the intermediate interconnections L1 due to a side wall transfer method or the like used therefor. Note that the side wall transfer method is a processing method for forming a pattern having a line width of the lithography limit or less. Specifically, a resist pattern is formed having a pitch twice the desired line width. Then, the resist slimming is performed and a first lower layer film is processed into a core material pattern and then the side wall is deposited. Finally, the core material is peeled and a second lower layer film formed under the first lower layer film is processed. The above is the side wall machining process.

In this way, two intermediate interconnections L1 passing through the via may generally double the contact area between the via and the intermediate interconnections L1 compared to one intermediate interconnection L1 passing through the via as shown in FIG. 3. Note that the number of interconnections passing through the via is not limited to two and may be three or more.

Second Embodiment

In the second embodiment, among intermediate interconnections contacting a middle portion of a via, an intermediate interconnection contacting to an upper portion of a via is contacted to a side surface of the via at the end portion thereof only. An intermediate interconnection contacting to a lower portion of a via is formed to penetrate the via, like in the first embodiment.

Figure 14:
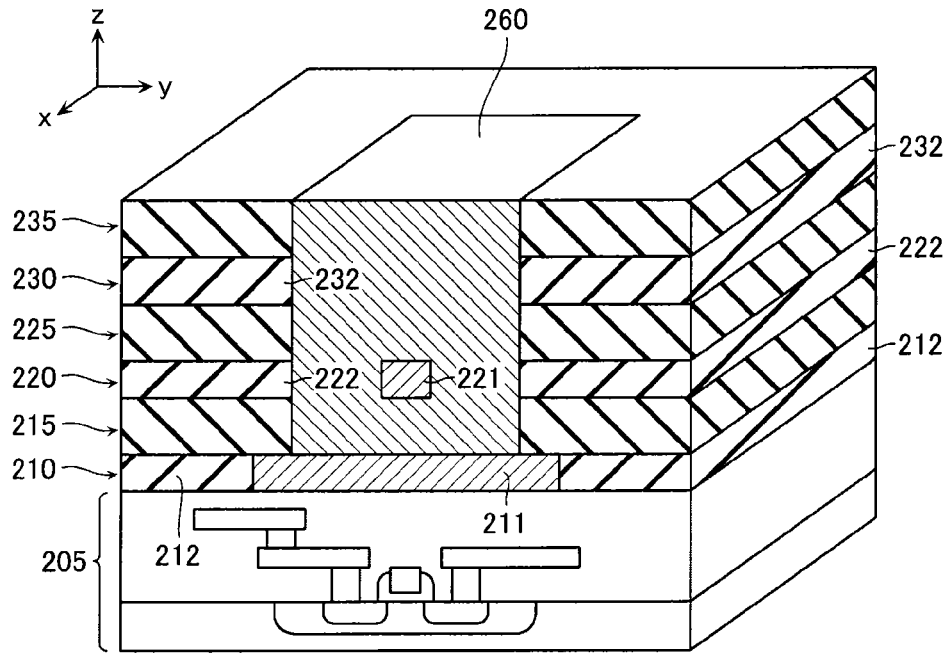
FIG. 14 is a perspective view of a peripheral portion of a via of a semiconductor device according to a second embodiment.
Figure 15:
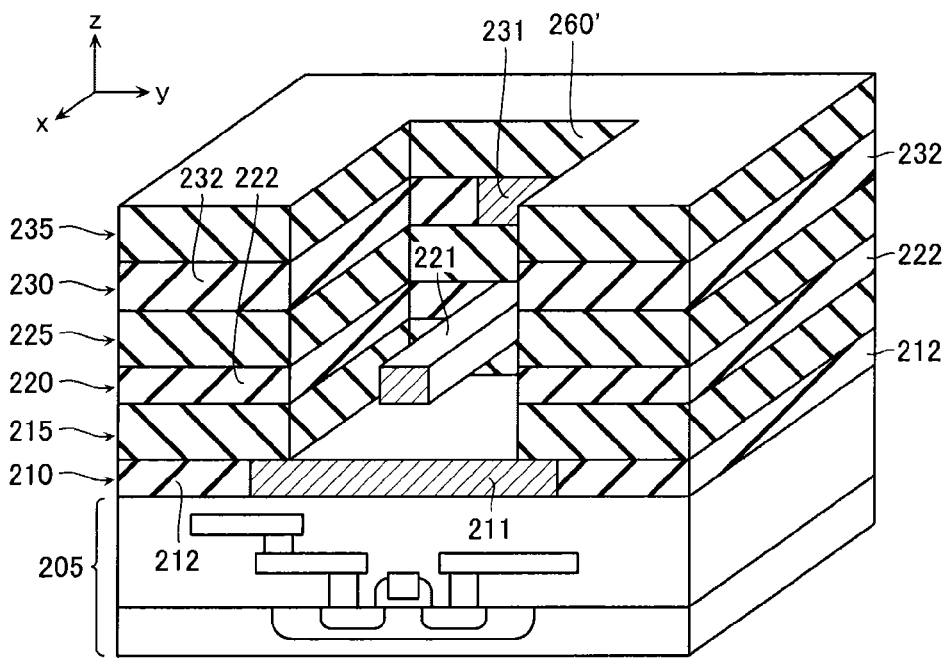
FIG. 15 is a perspective view of the peripheral portion of the via of the semiconductor device according to the embodiment.

FIG. 14 is a perspective view of a semiconductor device according to a second embodiment. FIG. 15 shows the internal structure of the semiconductor device according to this embodiment with a portion of the semiconductor device shown in FIG. 14 being removed for simplicity.

The semiconductor device according to this embodiment includes a silicon substrate 205 to an insulating layer 225, which are similar to the silicon substrate 105 to the insulating layer 125 of the semiconductor device according to the first embodiment, respectively. Additionally, this embodiment includes a second interconnect layer 230 and an insulating layer 235 on the insulating layer 225.

The second interconnect layer 230 includes, as shown in FIG. 15, a second interconnection 231 (a second type intermediate interconnection) and an insulating film 232 formed around the second interconnection 231. The second interconnection 231 is formed exposing the end portion thereof on the inner wall of the through-hole 260' into which the via 260 is embedded, as shown in FIG. 15. The second interconnection 231 is formed having a larger cross sectional area (line width) than the first interconnection 221 (the first type intermediate interconnection).

Now, a method of manufacturing the semiconductor device according to this embodiment will be described.

First, the process from the formation of the silicon substrate 205 to the stacking of a layer 225' that will serve as the insulating layer 225 is performed in a similar way to the process from the formation of the silicon substrate 105 to the formation of the layer 125' that will serve as an insulating layer in the first embodiment.

Figure 16:
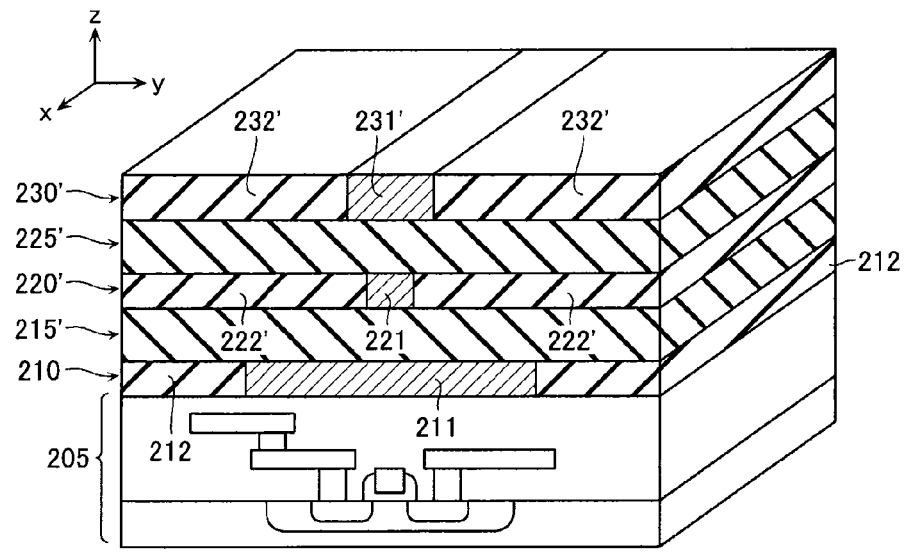
FIG. 16 illustrates a manufacturing process of the semiconductor device according to the embodiment.

Then, as shown in FIG. 16, a layer 230' that will serve as the second interconnect layer 230 is formed on the layer 225' that will serve as an insulating layer. A film 231' for the second interconnection 231 extending in the x-direction is thus formed. A film 232' that will serve as the insulating film 232 is formed on both sides in the y-direction of the second interconnection 231'.

Figure 17:
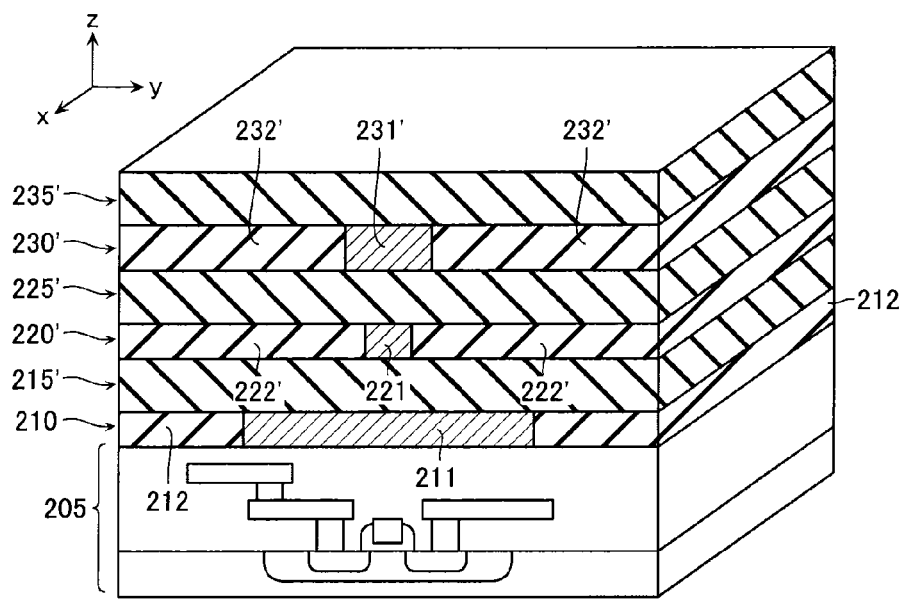
FIG. 17 illustrates a manufacturing process of the semiconductor device according to the embodiment.

Then, as shown in FIG. 17, a layer 235' that will serve as the insulating layer 235 is stacked on the layer 230' that will serve as the interconnect layer 230. This layer 235' may prevent, when an interconnection is provided in a further upper layer on the second interconnection 231, short-circuit between the second interconnection 231 and the upper-layer interconnection.

A through-hole 260' is formed from the top surface of the layer 235' that will serve as the insulating layer 235 to the top surface of the lower-layer interconnect layer 210. In so doing, the first interconnection 211 having a smaller cross sectional area is unremoved as in the first embodiment, and the film 231' that will serve as the second interconnection having a larger cross sectional area is removed, thereby forming the second interconnection 231. The end portion of the second interconnection 231 and a side surface of the via 260 formed later may thus be in contact with each other. In this embodiment, the second interconnection 231 has a larger cross sectional area than the first interconnection 221 formed at a lower position than the second interconnection 231. This allows, the second interconnection 231 to have a certain degree of contact area, thereby decreasing the contact resistance, although it contacts with the via 260 only at a side surface thereof.

Finally, as shown in FIG. 14, the through-hole 260' is embedded with a barrier metal and an interconnection material such as tungsten, aluminum, or copper. The via 260 is thus formed, thereby electrically connecting the lower-layer interconnection 211, the first interconnection 221, and the second interconnection 231. Then, unnecessary interconnection materials are removed by CMP.

Using the above manufacturing process, the semiconductor device shown in FIG. 14 may be manufactured.

Figure 18:
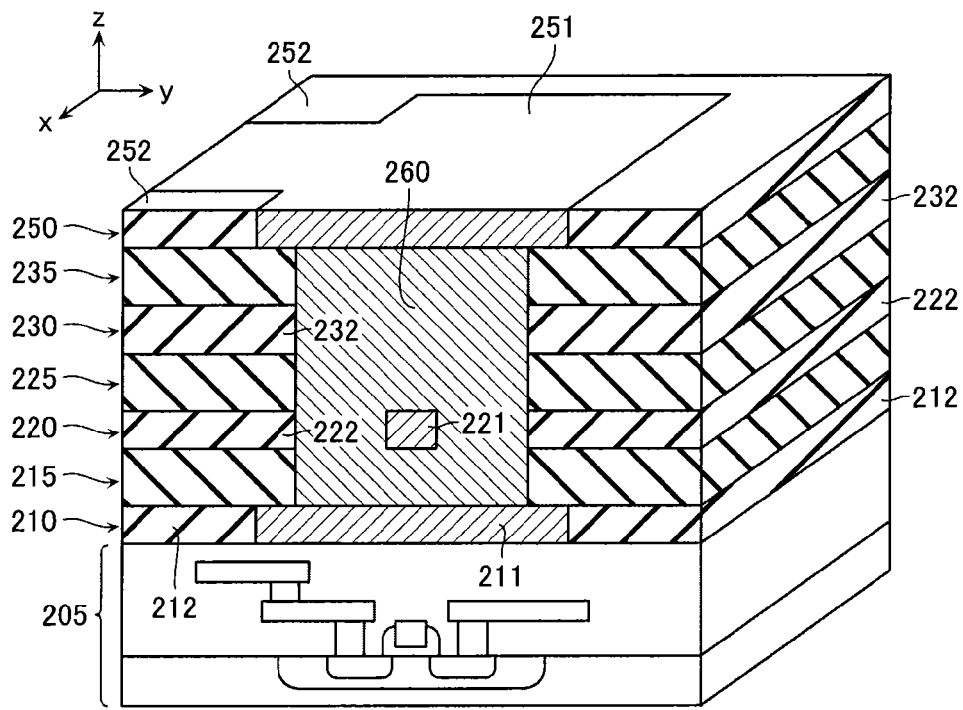
FIG. 18 is a perspective view of the peripheral portion of the via of the semiconductor device according to the embodiment.

Note that as shown in FIG. 18, as in the first embodiment, after the above manufacturing process, an upper-layer interconnect layer 250 may be formed on the via 260 and insulating layer 235. The upper-layer interconnect layer 250 includes an upper-layer interconnection 251 disposed to cover the region where the via 260 is formed, and an insulating film 252 disposed around the upper-layer interconnection 251.

Also, like the second interconnection 231 in this embodiment, a plurality of interconnect layers each having an intermediate interconnection in contact with only a side surface of a via may be stacked. In this case, a manufacturing process similar to that in FIG. 16 may be repeated by the number of desired layers.

Thus, this embodiment may provide a similar effect to that in the first embodiment. In addition, this embodiment may provide a semiconductor device having more interconnect layers without decreasing the contact area between the lower intermediate interconnection and the via by allowing an intermediate interconnection on an upper layer having a larger cross-section to be contact with only aside surface of a via.

Third Embodiment

A third embodiment provides a semiconductor device that is manufactured by omitting a process of removing a residual insulating film left under an intermediate interconnection which is the lowest among the intermediate interconnections in contact with a middle portion of a via. The residual insulating film is formed when a through-hole is formed.

Figure 19:
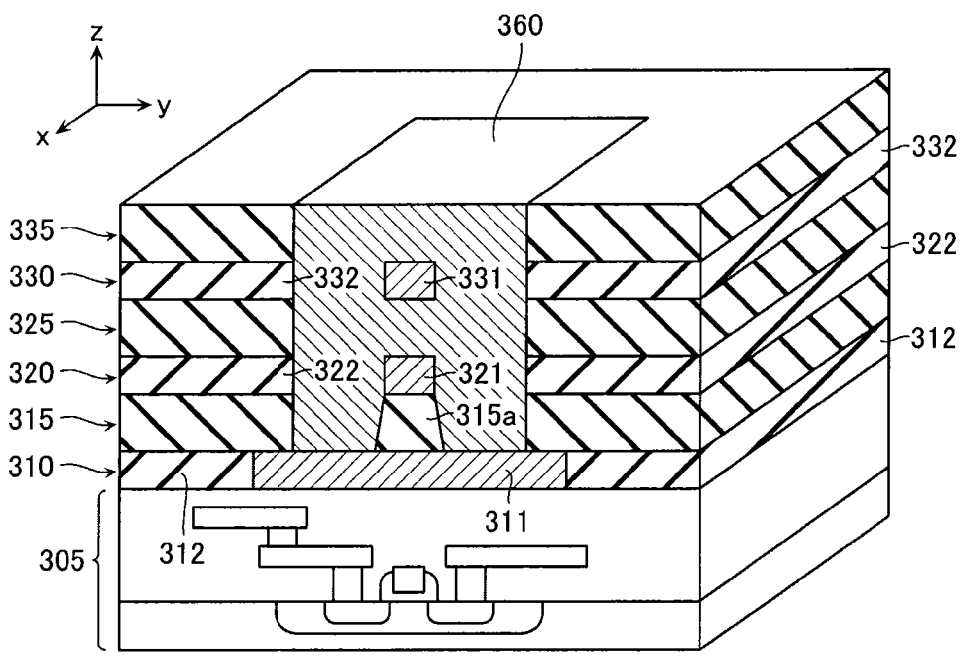
FIG. 19 is a perspective view of a peripheral portion of a via of a semiconductor device according to a third embodiment.
Figure 20:
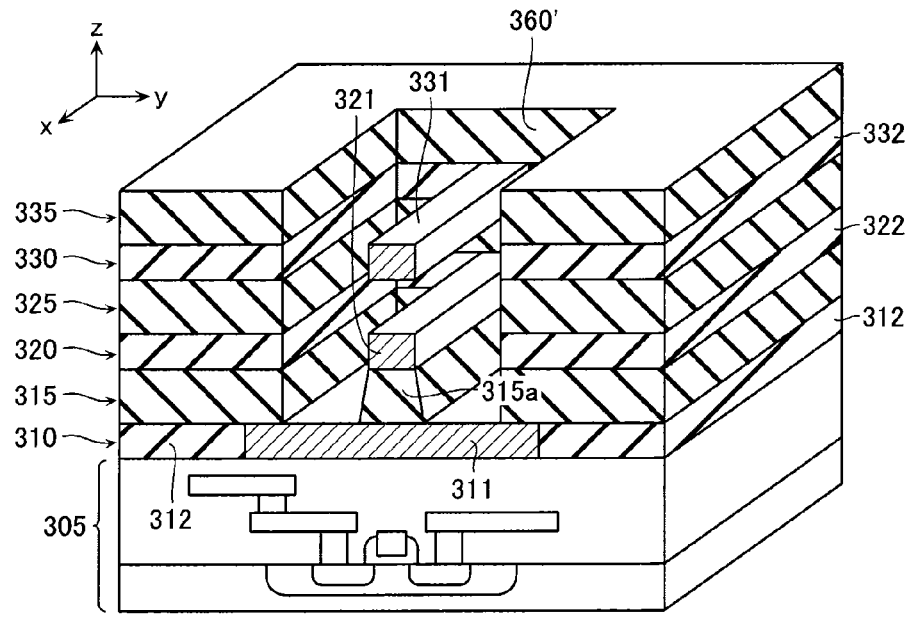
FIG. 20 is a perspective view of the peripheral portion of the via of the semiconductor device according to the embodiment.

FIG. 19 is a perspective view of a semiconductor device according to the third embodiment. FIG. 20 shows the internal structure of the semiconductor device according to this embodiment with a portion of the semiconductor device shown in FIG. 19 being removed for simplicity.

The semiconductor device according to this embodiment includes a silicon substrate 305 to an insulating layer 325 similar to the silicon substrate 105 to the insulating layer 125 of the semiconductor device according to the first embodiment. Additionally, this embodiment includes the second interconnect layer 330 and the insulating layer 335 on the insulating layer 325. However, in this embodiment, the residual insulating film left under the first interconnection 321 (the third type intermediate interconnection) in forming the through-hole 360' is not removed as described below. Accordingly, the residual insulating film 315a is formed as a portion of the insulating layer 315 under the first interconnection 321.

With reference to FIG. 20, the second interconnect layer 330 includes a second interconnection 331 (the first type intermediate interconnection) extending in the x-direction and insulating films 332 formed on the both sides of the second interconnection 331. Like the first interconnection 321, the second interconnection 331 is in contact with the via 360 on the top surface, bottom surface, and both side surfaces thereof.

The semiconductor device according to this embodiment may be manufactured by a manufacturing process similar to that in the first embodiment except that the manufacturing processes shown in FIG. 7 and FIG. 8 are performed twice after the manufacturing process shown in FIG. 6, and the process of removing the residual insulating film 315a under the first interconnection 321 is omitted in the manufacturing process shown in FIG. 2.

Figure 22:
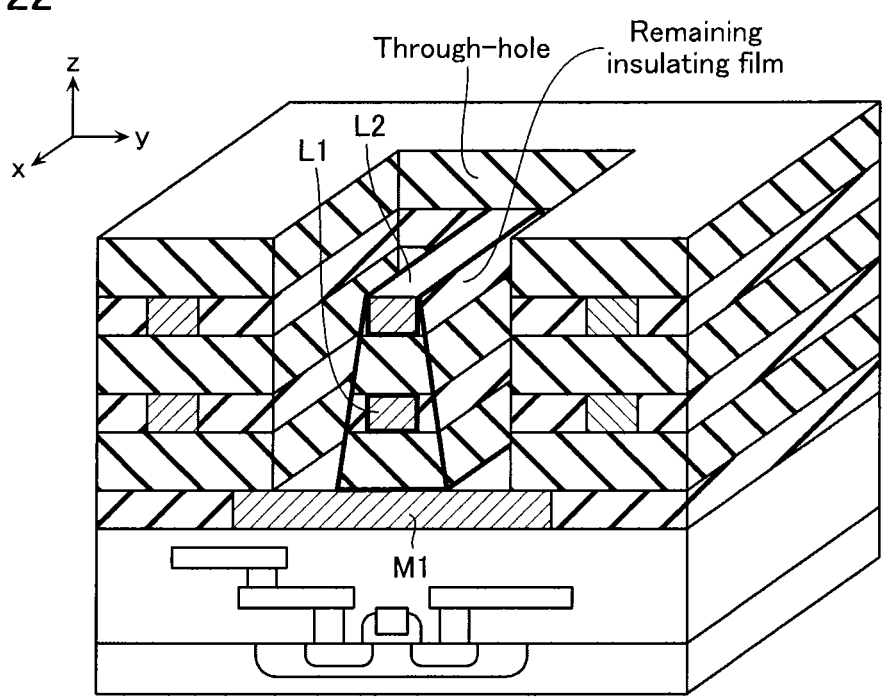
FIG. 22 is an arrangement diagram of interconnections in a via of a semiconductor device in the comparative example.

As described in the first embodiment, the residual insulating film left under the intermediate interconnection in forming the through-hole is removed by isotropic etching. Thus, even if an interconnection width is smaller enough than the via diameter, the removal of the residual insulating film near the bottom of the through-hole may result in a larger via diameter depending on the aspect ratio of the through-hole. If all removal processes of the residual insulating films are omitted, the lower intermediate interconnection is covered by the forward tapered residual insulating film (shown in the heavy line in FIG. 22) left under the upper intermediate interconnections as shown in FIG. 22. Thus, the lower intermediate interconnection has a smaller exposed area in the through-hole, thereby providing, at worst, no contact between the via and the lower intermediate interconnection.

In that regard, according to this embodiment, the contact area between the via and the intermediate interconnection may be ensured, and the removal of the residual insulating film left under the lowest intermediate interconnection is omitted, thereby limiting the increase of the via diameter, accordingly.

Figure 21:
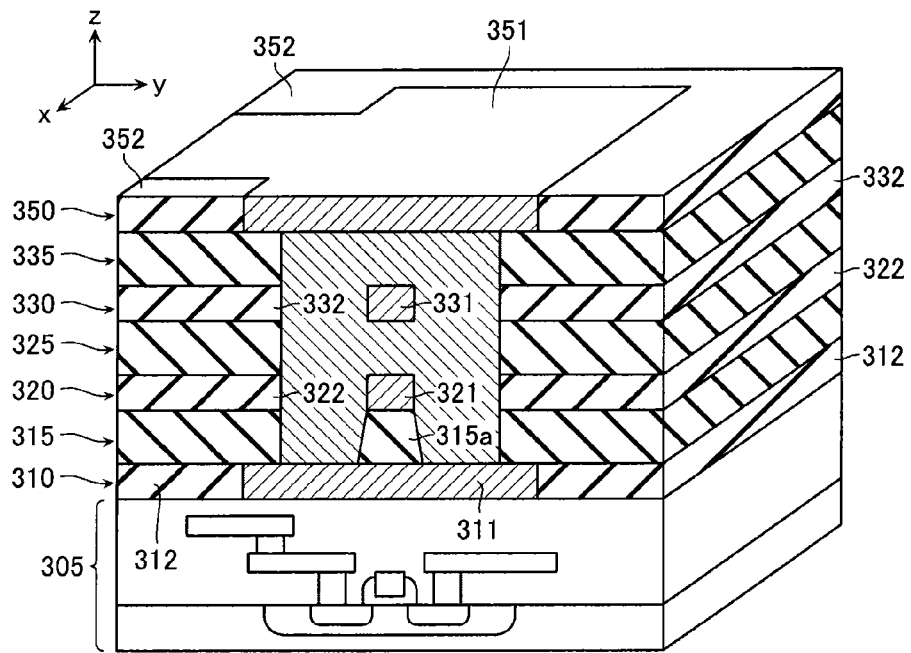
FIG. 21 is a perspective view of the peripheral portion of the via of the semiconductor device according to the embodiment.

Note that as shown in FIG. 21, as in the first embodiment, an upper-layer interconnect layer 350 may be formed on the via 360 and the insulating layer 335, the upper-layer interconnect layer 350 including an upper-layer interconnection 351 disposed covering the formation region of the via 360 and insulating films 352 disposed around the upper-layer interconnection 351.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a plurality of interconnect layers disposed at different heights from the semiconductor substrate, each interconnect layer comprising an interconnection formed therein; and
a via formed in a columnar shape extending in the stack direction of the interconnect layers, the via electrically connecting the interconnections of the different interconnect layers, the via being formed from one electrically conductive film,
the interconnections including an intermediate interconnection in contact with the via in an intermediate portion thereof, and
the intermediate interconnection including a first type intermediate interconnection passing through the via in a direction perpendicular to the stack direction and in contact with the via on the top surface, bottom surface, and both side surfaces thereof.

2. The semiconductor device according to claim 1, wherein one of the plurality of interconnect layers includes a plurality of the first type intermediate interconnections extending in parallel with each other.

3. The semiconductor device according to claim 1, wherein the intermediate interconnections further includes a second type intermediate interconnection that is, in contact with a side surface of the via at the end portion thereof, and is electrically connected to the first intermediate interconnection.

4. The semiconductor device according to claim 3, wherein the second type intermediate interconnection has a larger cross sectional area than the first type intermediate interconnection.

5. The semiconductor device according to claim 1, wherein the intermediate interconnection further includes a third type intermediate interconnection that passes through the via in a direction perpendicular to the stack direction and is in contact with the via, at least on the top surface thereof.

6. The semiconductor device according to claim 5, wherein the third intermediate interconnection is in contact with the via, on both side surfaces thereof.

7. The semiconductor device according to claim 1, wherein the interconnections include a lower-layer interconnection in contact with the via on the bottom surface thereof.

8. The semiconductor device according to claim 1, wherein the interconnections include an upper-layer interconnection in contact with the via on the top surface thereof.

9. The semiconductor device according to claim 1, wherein the via includes an electrically conductive film extending from a top surface to a bottom surface thereof.

10. The semiconductor device according to claim 9, wherein
one of the plurality of interconnect layers includes a plurality of the first type intermediate interconnections extending in parallel with each other.

11. The semiconductor device according to claim 9, wherein
the intermediate interconnection further includes a second type intermediate interconnection that is, in contact with a side surface of the via at the end portion thereof, and is electrically connected to the first intermediate interconnection.

12. The semiconductor device according to claim 11, wherein
the second type intermediate interconnection has a larger cross sectional area than the first type intermediate interconnection.

13. The semiconductor device according to claim 9, wherein
the first intermediate interconnection further includes a third type intermediate interconnection is in contact with the via, at least on the top surface thereof.

14. The semiconductor device according to claim 9, wherein
the interconnections further include a lower-layer interconnection in contact with the via on the bottom surface thereof.

15. The semiconductor device according to claim 9, wherein
the interconnections further include an upper-layer interconnection in contact with the via on the top surface thereof.

\* \* \* \* \*